United States Patent
Koc et al.

(10) Patent No.: US 7,576,474 B2
(45) Date of Patent: Aug. 18, 2009

(54) PIEZOELECTRIC MOTOR

(75) Inventors: Burhanettin Koc, Gyunggi-do (KR); Dong Kyun Lee, Seoul (KR); Hyun Phill Ko, Seoul (KR); Byung Woo Kang, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/907,522

(22) Filed: Oct. 12, 2007

(65) Prior Publication Data

US 2008/0093953 A1    Apr. 24, 2008

(30) Foreign Application Priority Data

Oct. 16, 2006    (KR) .................. 10-2006-0100150

(51) Int. Cl.
*H02N 2/00* (2006.01)

(52) U.S. Cl. .................. 310/323.13; 310/323; 310/316

(58) Field of Classification Search ............ 310/323, 310/316; *H02N 2/00, 2/08, 2/10, 2/12*
See application file for complete search history.

(56) References Cited

U.S. PATENT DOCUMENTS

| 5,233,258 | A  | * | 8/1993 | Myoga et al. | 310/323.17 |
| 6,879,085 | B1 | * | 4/2005 | Shiv et al. | 310/312 |
| 7,211,929 | B2 | * | 5/2007 | Ganor et al. | 310/317 |
| 2006/0006764 | A1 | * | 1/2006 | Ganor et al. | 310/328 |

* cited by examiner

*Primary Examiner*—Quyen Leung
*Assistant Examiner*—Bryan P Gordon

(57) ABSTRACT

A piezoelectric motor for generating an elliptic motion by adding a longitudinal vibration to a bending-direction vibration is provided. The piezoelectric motor includes a piezoelectric member which generates a first vibration mode and a second vibration mode simultaneously by an applied power and a frictional member of which a portion is insertedly attached into a concave portion indentedly formed on one side of the piezoelectric member, wherein the frictional member is in an elliptic motion by the vibration generated by the piezoelectric member, so that an influence of the attachment of the frictional member to a resonance frequency can be minimized. Accordingly, a driving efficiency of the piezoelectric motor can be improved. In addition, attachment strength of the frictional member can be improved.

6 Claims, 14 Drawing Sheets

PIEZOELECTRIC MOTOR

CROSS-REFERENCE TO RELATED APPLICATIONS

This application claims the priority of Korean Patent Application No. 2006-100150 filed on Oct. 16, 2006, in the Korean Intellectual Property Office, the disclosure of which is incorporated herein by reference.

BACKGROUND OF THE INVENTION

1. Field of the Invention

The present invention relates to a piezoelectric motor, and more particularly, to a piezoelectric motor for generating an elliptic motion by adding a longitudinal vibration to a bending-direction vibration.

2. Description of the Related Art

Recently, much attention has been paid to a new piezoelectric motor (piezoelectric ultrasonic motor) using a piezoelectric member as a substitute for an electromagnetic motor. In the piezoelectric motor, a piezoelectric vibrator generates a high-frequency vibration having an infinitesimal amplitude, and the infinitesimal amplitude is transmitted through contact friction between a frictional member attached to the piezoelectric vibrator and a slider (or rotor), so that the slider can perform an infinitesimal motion. In comparison with a conventional electromagnetic motor, the piezoelectric motor has many advantages such as an availability of miniaturization, a high resolution, and a low noise.

FIG. 1 is a schematic view illustrating a structure of a conventional piezoelectric motor.

As shown in FIG. 1, the piezoelectric motor typically includes a piezoelectric member 10 and a frictional member 30 attached to one side of the piezoelectric member 10.

The piezoelectric member 10 is formed by laminating a plurality of piezoelectric devices made of ceramics or the like. Internal electrodes are formed on surfaces of the piezoelectric devices, so that the piezoelectric member can be partitioned into a plurality of vibration portions. A pattern of internal electrodes may be formed on the surface of each piezoelectric device in various shapes according to a type of vibration, a vibration direction, the number of attached frictional members, and positions of the attached frictional members. Wire lines or external electrodes 21 and 22 which connect the internal electrodes are provided to the piezoelectric member so that two vibration portions 11 and 14 or 12 and 13 that are disposed in a diagonal direction are applied with an in-phase alternating voltage. As described above, the frictional member 30 made of ceramics or a supperhardened alloy is attached on the one side surface of the piezoelectric member 10 so as to transmit the vibration externally.

More specifically, referring to FIG. 1, the piezoelectric member 10 is partitioned into four vibration portions 11, 12, 13, and 14. The two vibration portions 11 and 14 or 12 and 13 that are disposed in the diagonal direction are applied with the in-phase alternating voltage through the wire lines or external electrodes 21 and 22.

When the voltage is applied, the piezoelectric member 10 generates two vibration modes, for example, a stretching vibration mode and a bending vibration mode. In the stretching vibration mode, the piezoelectric member 10 is stretchably deformed in the longitudinal direction thereof, and in the bending vibration mode, the piezoelectric member 10 is bendably deformed in the thickness direction thereof.

Since the two vibration modes are generated simultaneously, an elliptic motion occurs in the frictional member 30. The elliptic motion of the frictional member 30 is transmitted to the slider or the rotor, so that a linear motion of the slider or a rotational motion of the rotor can be obtained.

In the conventional piezoelectric motor, a change in mass caused from the frictional member attached to the piezoelectric member influences a driving frequency of the piezoelectric motor. Therefore, it is difficult to electrically drive and control the piezoelectric motor.

In general, as a size of the piezoelectric member is decreased, a resonance frequency is increased. For example, if the length of the piezoelectric member is reduced down to 5 mm, the resonance frequency is increased up to 300 kHz or more. In such a high frequency, an acceleration of 200,000 $mm/s^2$ or more is exerted on the surface of the frictional member. Due to the high acceleration, the frictional member may be detached from the surface of the piezoelectric member. As an approach for preventing detachment of the frictional member from the surface of the piezoelectric member, there is proposed a method of increasing an amount of coated adhesive. However, the increase in the amount of coated adhesive causes a problem of a great change in the resonance frequency.

In addition, since the frictional member is attached on the surface of the piezoelectric member, the position of attachment of the frictional member is irregular, so that the resonance frequency may be greatly changed.

SUMMARY OF THE INVENTION

An aspect of the present invention provides a piezoelectric motor capable of minimizing an influence of attachment of a frictional member to a resonance frequency.

Another aspect of the present invention provides a piezoelectric motor capable of increasing attachment strength of a frictional member.

Still another aspect of the present invention provides a piezoelectric motor capable of maintaining a position of attachment of a frictional member so as to minimize a change in the resonance frequency according to a change in the position of attachment of the frictional member.

Further still another aspect of the present invention provides a piezoelectric motor capable of improving an efficiency of the piezoelectric motor.

According to an aspect of the present invention, there is provided a piezoelectric motor comprising: a piezoelectric member which generates a first vibration mode and a second vibration mode simultaneously by an applied power; and a frictional member of which a portion is insertedly attached into a concave portion indentedly formed on one side of the piezoelectric member, the frictional member being in an elliptic motion by the vibration generated by the piezoelectric member.

In the above aspect, when a thickness of the frictional member and an insertion depth of the frictional member inserted into the concave portion are indicated by w and x, respectively, the piezoelectric motor may satisfy an insertion ratio x/w expressed by the following Conditional Equation,

[Conditional Equation]

$$0.1 \leq x/w \leq 0.5.$$

In addition, a plurality of the concave portions may be formed on the piezoelectric member, and the frictional members may be insertedly attached into the concave portions.

In addition, the frictional member may have a circular cross section or a prismatic cross section. The frictional member may include a curved-surface protrusion which is formed to protrude outward from the piezoelectric member.

In addition, the first vibration mode may be a stretching vibration mode generated in a longitudinal direction of the piezoelectric member, and the second vibration mode may be a bending vibration mode generated in a thickness-direction of the piezoelectric member.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Hereinafter, exemplary embodiments of the present invention will now be described in detail with reference to the accompanying drawings.

Figure 1:
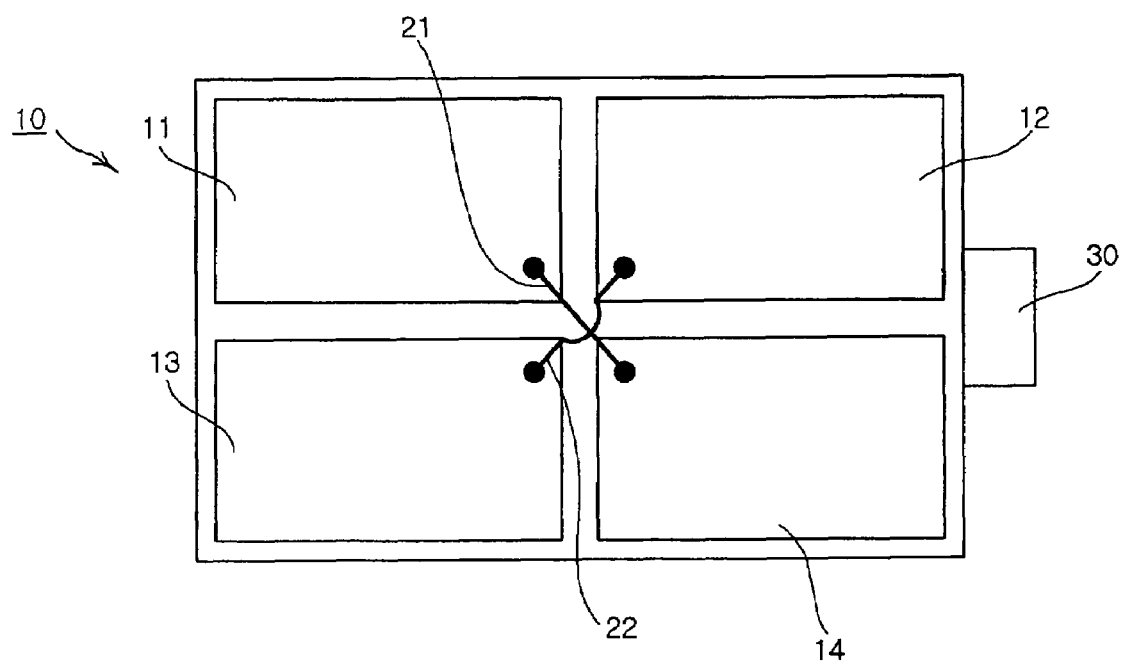
FIG. 1 is a schematic view illustrating a structure of a conventional piezoelectric motor.
Figure 2A:
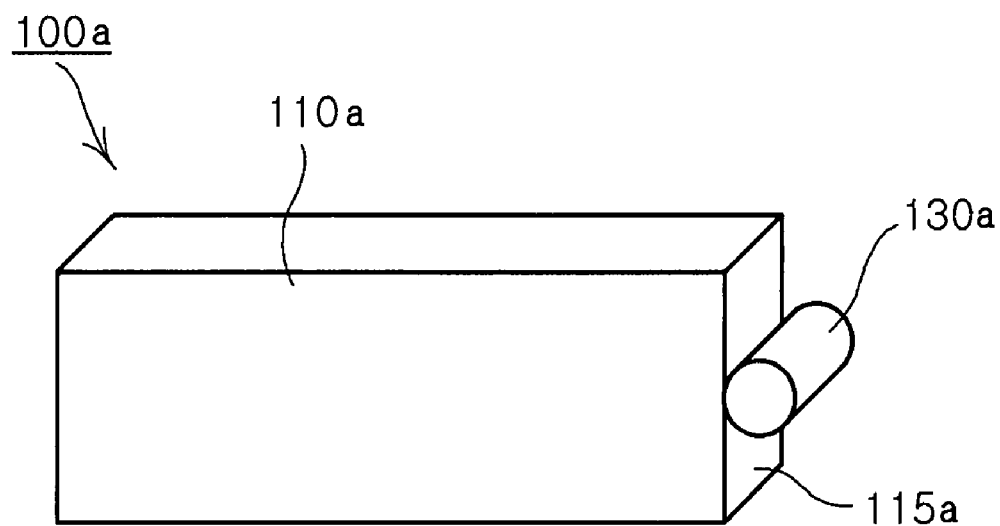
FIGS. 2A and 2B are a perspective view and a plan view illustrating a structure of a general piezoelectric motor, respectively.
Figure 2B:
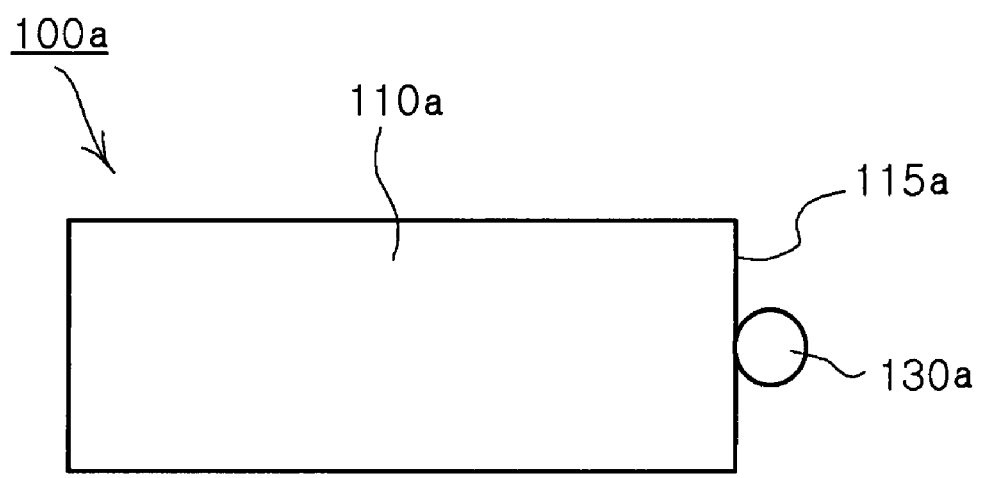
Figure 3:
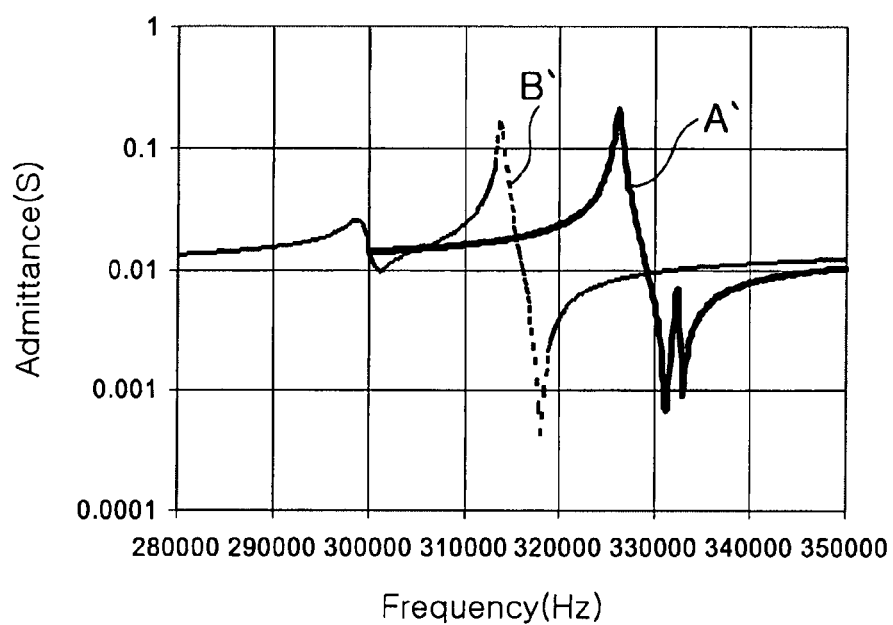
FIG. 3 is a graph illustrating a relationship between a frequency and an admittance of the general piezoelectric motor.
Figure 4:
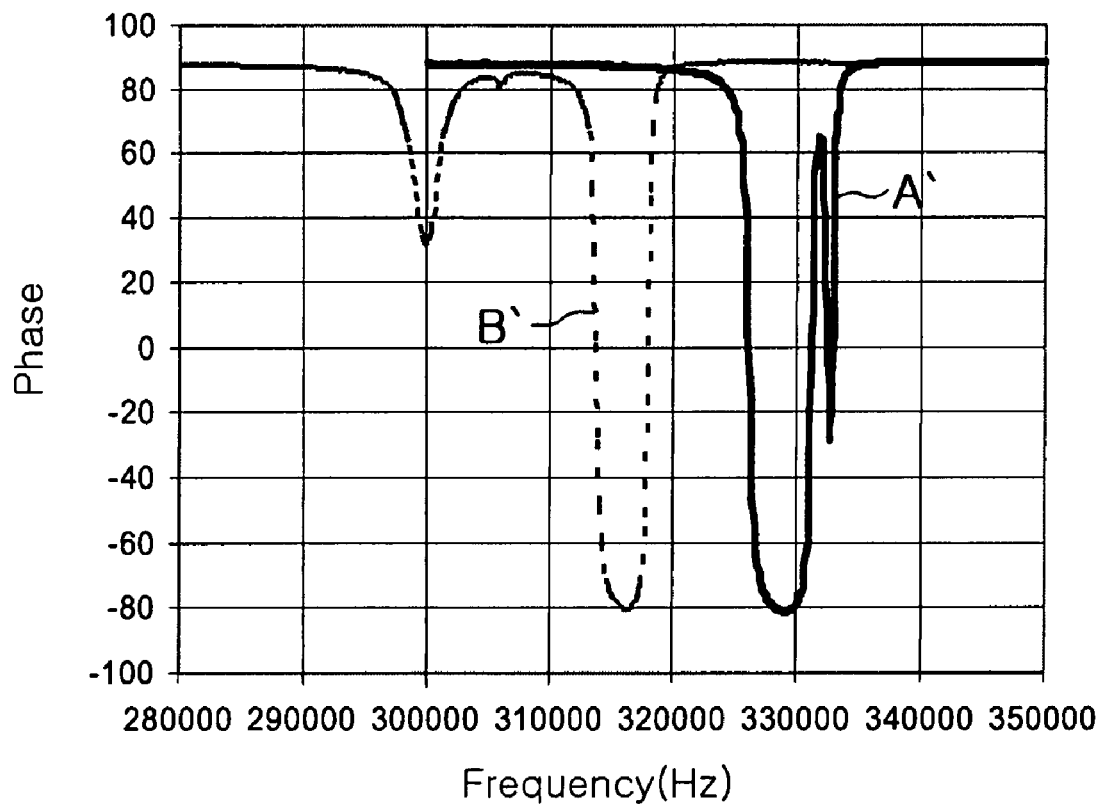
FIG. 4 is a graph illustrating a change in a phase with respect to a frequency of the general piezoelectric motor.

FIGS. 2A and 2B are a perspective view and a plan view illustrating a structure of a general piezoelectric motor, respectively. FIG. 3 is a graph illustrating a relationship between a frequency and an admittance of the general piezoelectric motor. FIG. 4 is a graph illustrating a change in a phase with respect to a frequency of the general piezoelectric motor.

Figure 5A:
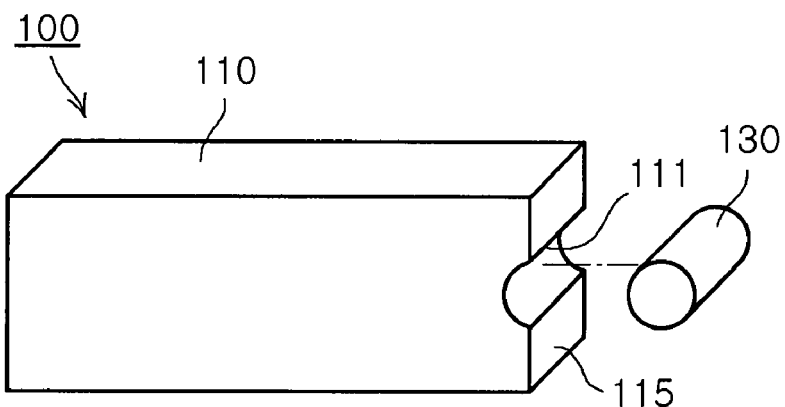
FIGS. 5A, 5B, and 5C are a perspective exploded view, a perspective coupled-state view illustrating a structure of a piezoelectric motor according to the present invention, respectively.
Figure 5B:
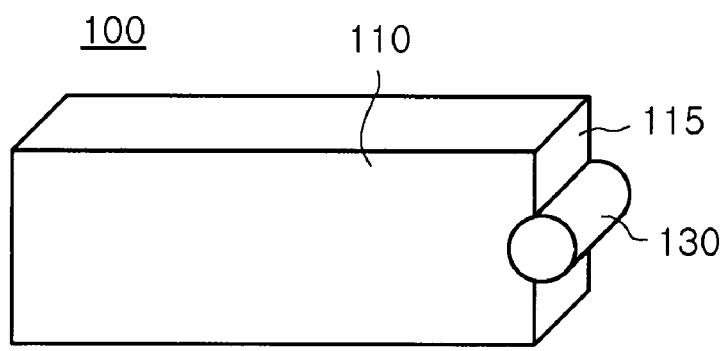
Figure 5C:
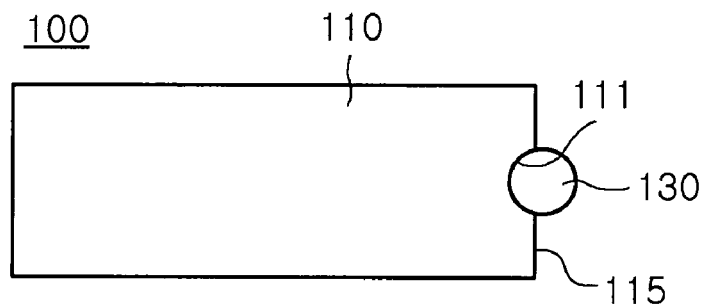
Figure 6:
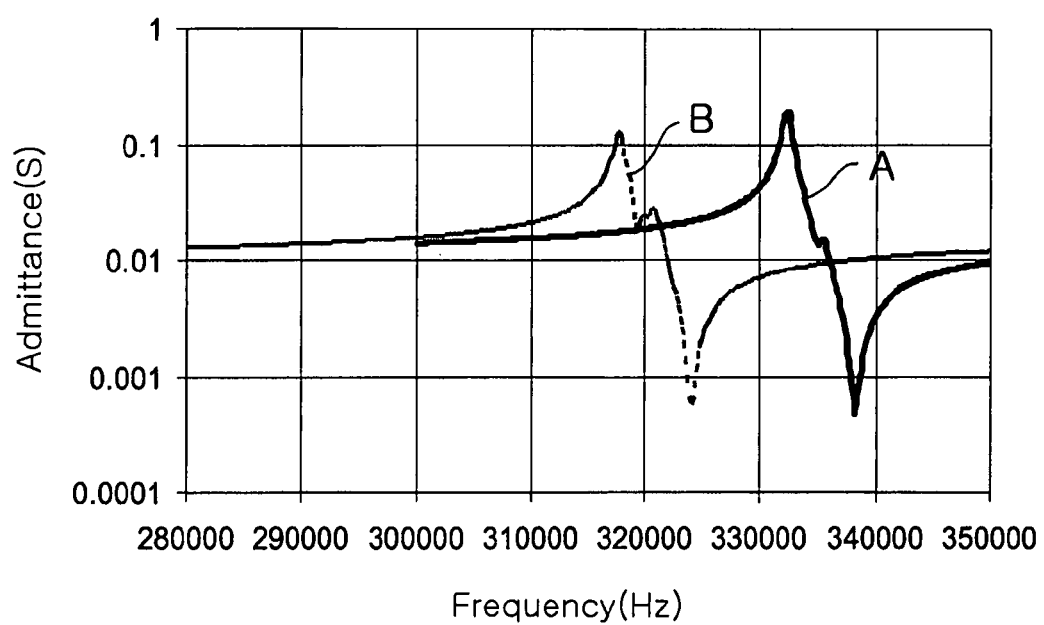
FIG. 6 is a graph illustrating a relationship between a frequency and an admittance of the piezoelectric motor according to the present invention.
Figure 7:
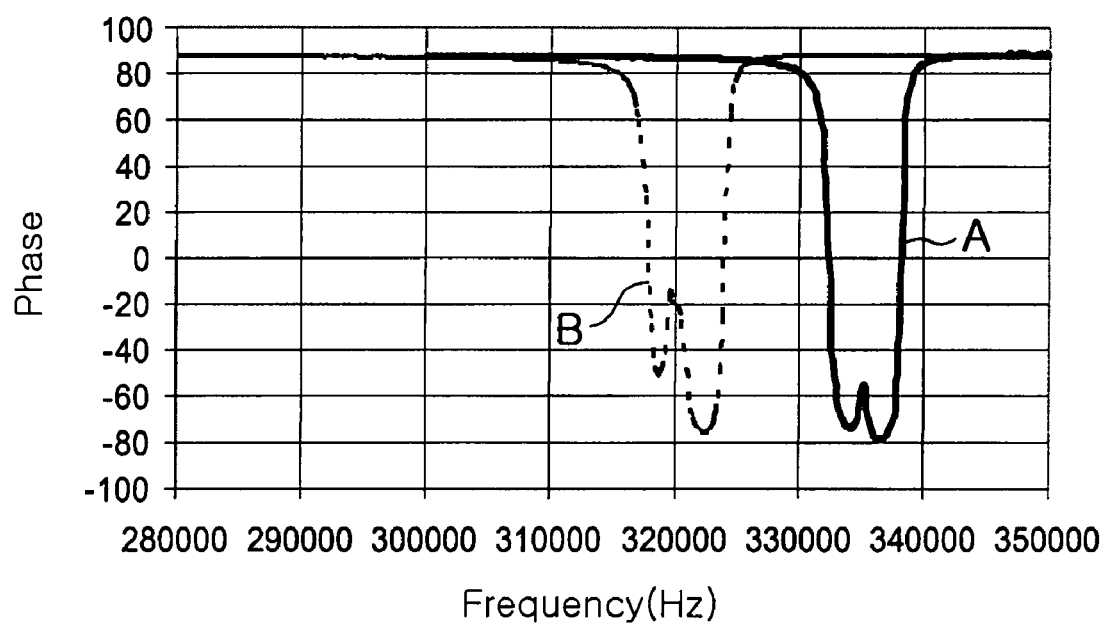
FIG. 7 is a graph illustrating a change in a phase with respect to a frequency of the piezoelectric motor according to the present invention.

FIGS. 5A, 5B, and 5C are a perspective exploded view, a perspective coupled-state view illustrating a structure of a piezoelectric motor according to the present invention, respectively. FIG. 6 is a graph illustrating a relationship between a frequency and an admittance of the piezoelectric motor according to the present invention. FIG. 7 is a graph illustrating a change in a phase with respect to a frequency of the piezoelectric motor according to the present invention.

Figure 8A:
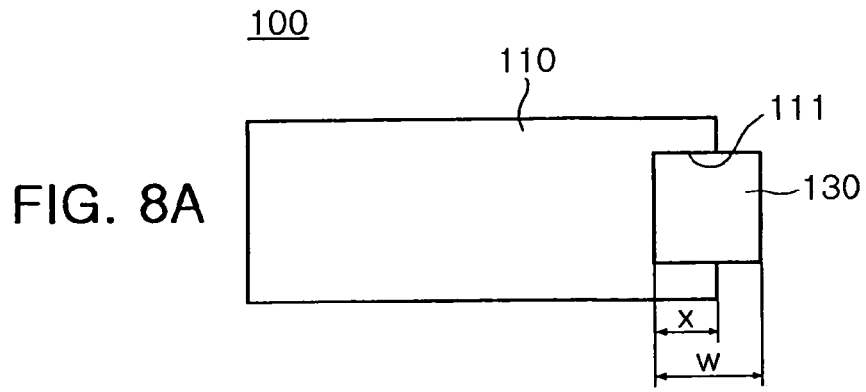
FIGS. 8A and 8B are a plan view and a perspective view illustrating a structure of the piezoelectric motor according to an embodiment of the present invention.
Figure 8B:
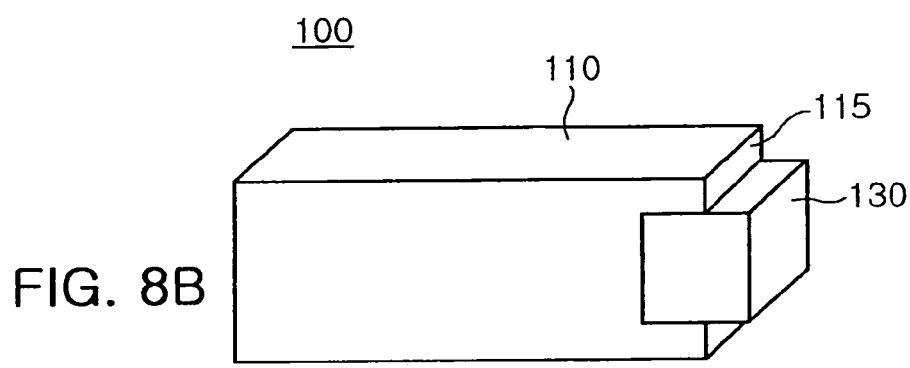
Figure 8C:
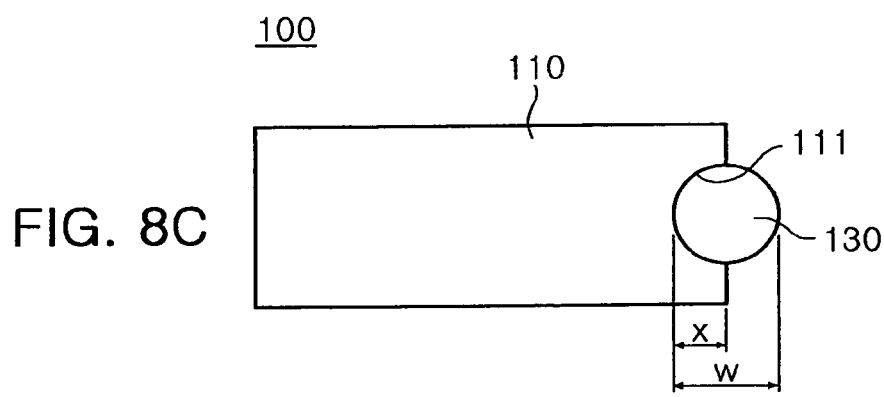
FIGS. 8C and 8D are plan views illustrating a structure of the piezoelectric motor according to another embodiment of the present invention.
Figure 8D:
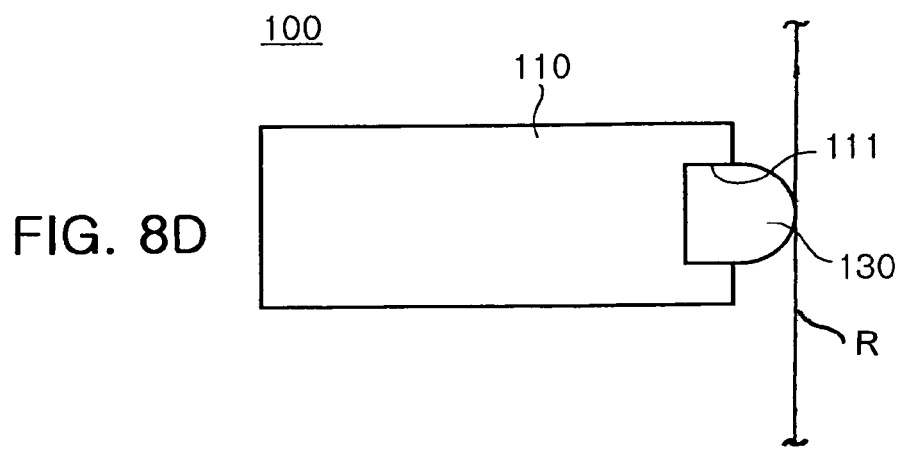
Figure 9:
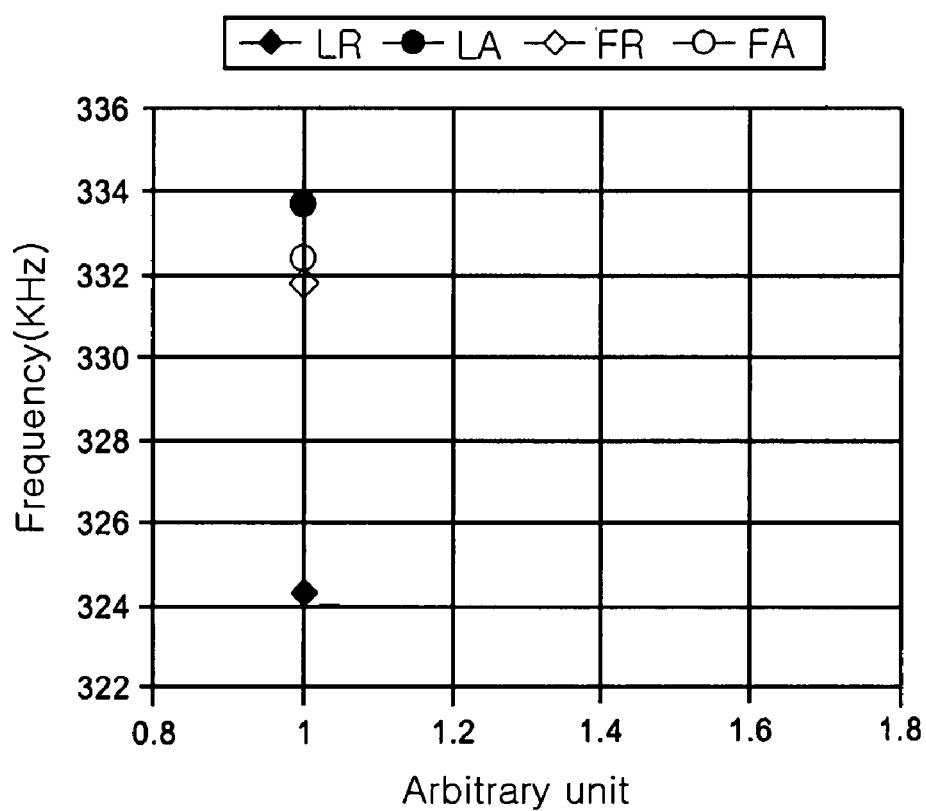
FIG. 9 is a graph illustrating frequencies of vibration modes of the piezoelectric motor in a state that a frictional member is not attached.
Figure 10A:
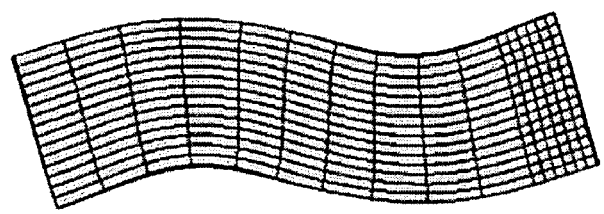
FIG. 10 illustrates shapes of vibration modes of the piezoelectric motor in a state that a frictional member is not attached, in which (a), (b), (c), and (d) illustrate a shape of vibration mode at a resonance frequency of a stretching vibration mode, a shape of vibration mode at a resonance frequency of a bending vibration mode, a shape of vibration mode at an anti-resonance frequency of a bending vibration mode, and a shape of vibration mode at an anti-resonance frequency of a stretching vibration mode, respectively.
Figure 10B:
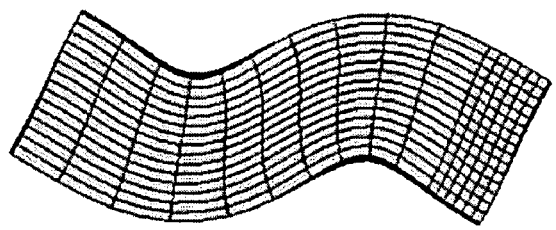
Figure 10C:
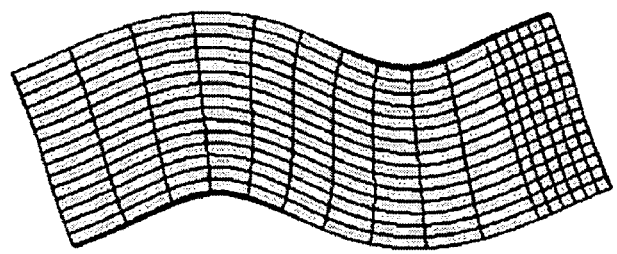
Figure 10D:
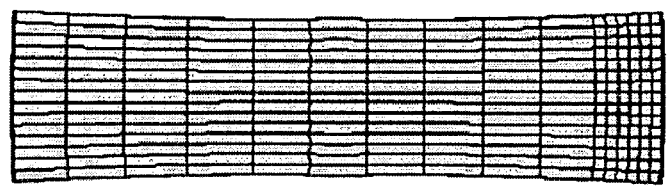
Figure 11:
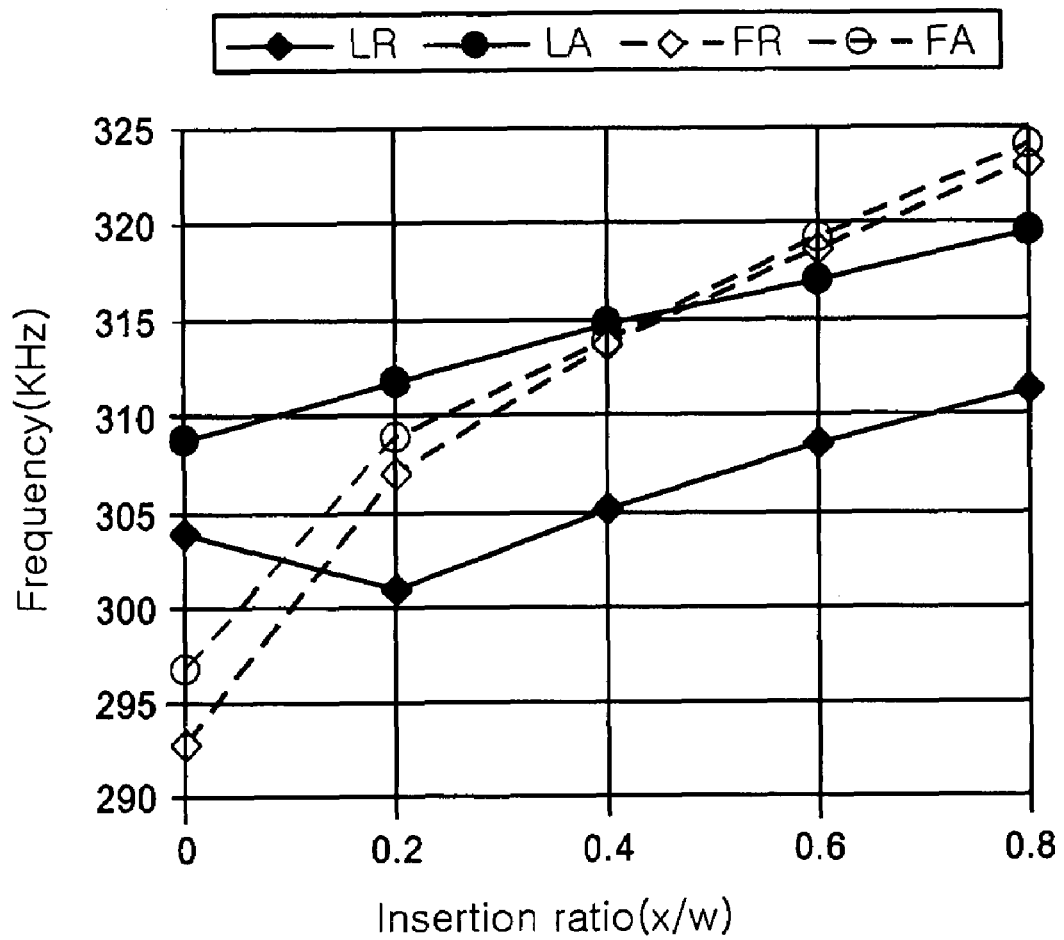
FIG. 11 is a graph illustrating frequencies of vibration modes of the piezoelectric motor according to an insertion ratio of a frictional member.
Figure 12A:
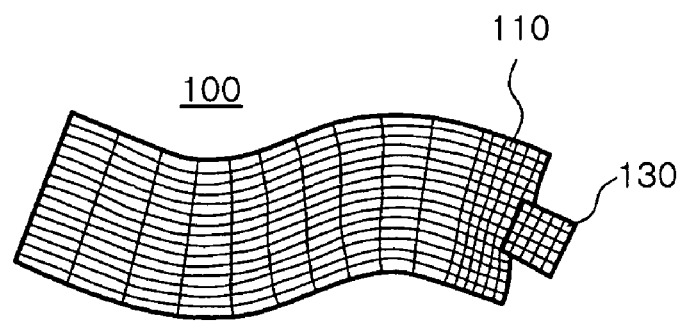
FIG. 12 illustrates shapes of vibration modes of the piezoelectric motor in a case where the insertion ratio of the frictional member is 0.2, in which (a), (b), (c), and (d) illustrate a shape of vibration mode at a resonance frequency of a stretching vibration mode, a shape of vibration mode at a resonance frequency of a bending vibration mode, a shape of vibration mode at an anti-resonance frequency of a bending vibration mode, and a shape of vibration mode at an anti-resonance frequency of a stretching vibration mode, respectively.
Figure 12B:
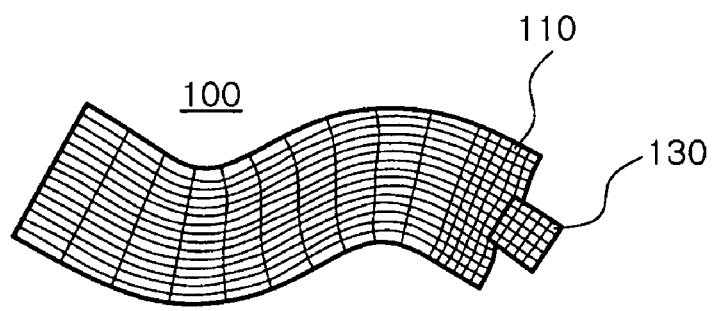
Figure 12C:
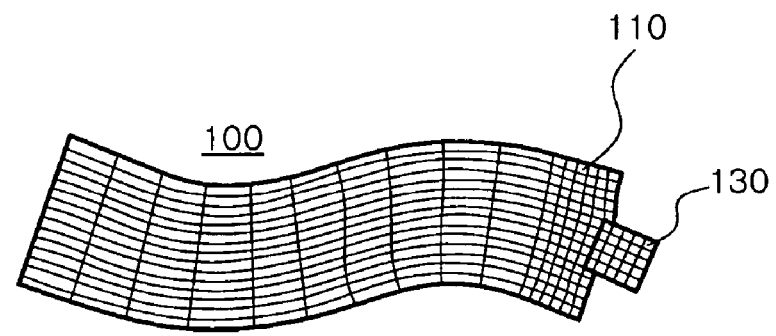
Figure 12D:
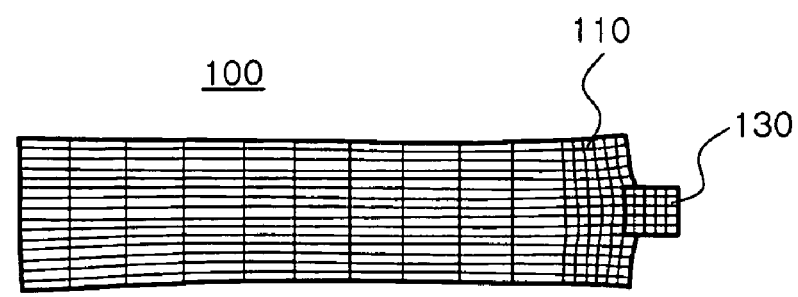
Figure 13A:
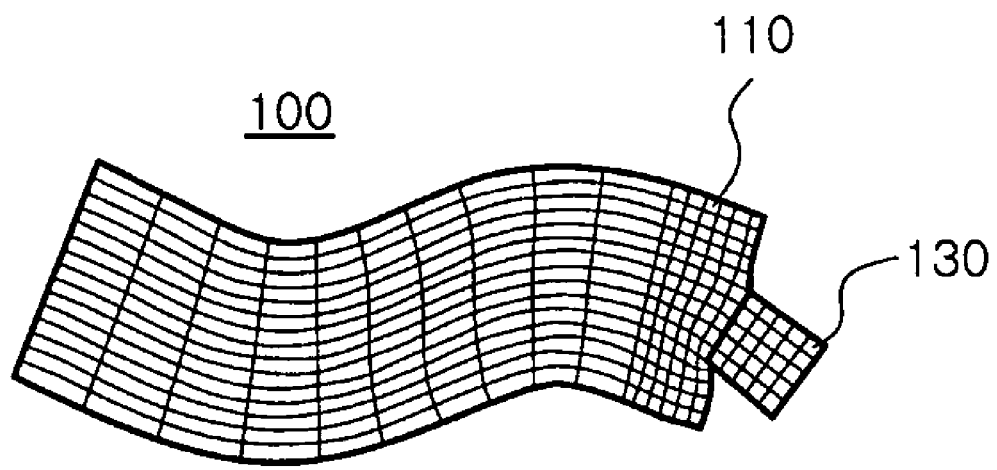
FIG. 13 illustrates shapes of vibration modes of the piezoelectric motor in a case where the insertion ratio of the frictional member is 0, that is, in a case where the frictional member 130 is attached on a surface of the piezoelectric member 110, in which (a) and (b) illustrate a shape of vibration mode at a resonance frequency of a bending vibration mode and a shape of vibration mode at an resonance frequency of a stretching vibration mode, respectively.
Figure 13B:
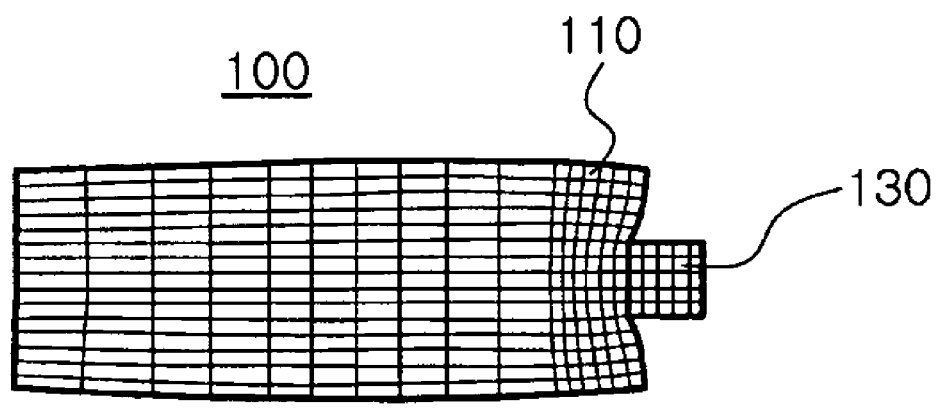
Figure 14A:
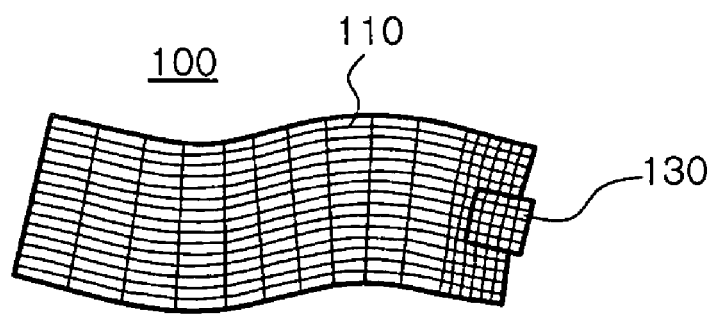
FIG. 14 illustrates shapes of vibration modes of the piezoelectric motor in a case where the insertion ratio of the frictional member is 0.8, in which (a), (b) and (c) illustrate a shape of vibration mode at a resonance frequency of a stretching vibration mode, a shape of vibration mode at an anti-resonance frequency of a stretching vibration mode, and a shape of vibration mode at an resonance frequency of a bending vibration mode, respectively.
Figure 14B:
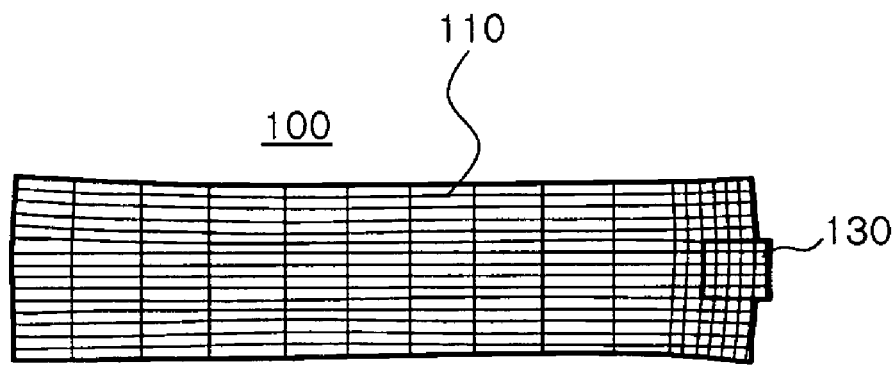
Figure 14C:
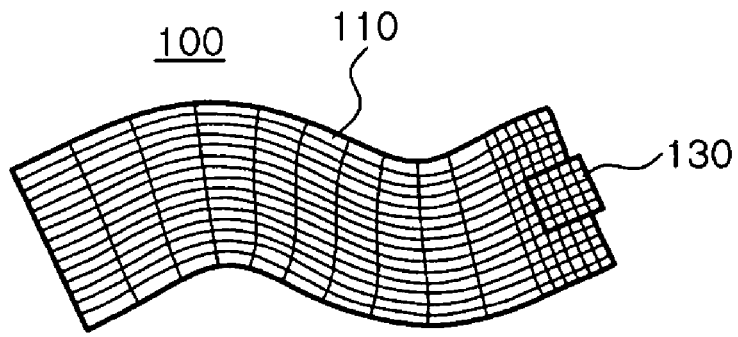

FIGS. 8A and 8B are a plan view and a perspective view illustrating a structure of the piezoelectric motor according to an embodiment of the present invention, and FIGS. 8C and 8D are plan views illustrating a structure of the piezoelectric motor according to another embodiment of the present invention. FIG. 9 is a graph illustrating frequencies of vibration modes of the piezoelectric motor in a state that a frictional member is not attached. FIG. 10 is schematic view illustrating shapes of vibration modes of the piezoelectric motor in a state that a frictional member is not attached. FIG. 11 is a graph illustrating frequencies of vibration modes of the piezoelectric motor according to an insertion ratio of a frictional member. FIG. 12 is schematic view illustrating shapes of vibration modes of the piezoelectric motor in a case where the insertion ratio of the frictional member is 0.2. FIG. 13 is schematic view illustrating shapes of vibration modes of the piezoelectric motor in a case where the insertion ratio of the frictional member is 0, that is, in a case where the frictional member 130 is attached on a surface of the piezoelectric member 110. FIG. 14 is schematic view illustrating shapes of vibration modes of the piezoelectric motor in a case where the insertion ratio of the frictional member is 0.8.

As shown in FIGS. 5 and 8, the piezoelectric motor 100 includes a piezoelectric member 110 which generates a first vibration mode and a second vibration mode simultaneously by an applied power and a frictional member 130 of which a portion is insertedly attached into a concave portion 111 indentedly formed on one side of the piezoelectric member 110, wherein the frictional member 130 can be in an elliptic motion by the vibration generated by the piezoelectric member 110.

The piezoelectric member 110 is formed by laminating a plurality of piezoelectric devices. A pattern of internal electrodes are formed suitably on a surface of each piezoelectric device, so that the piezoelectric member 110 generates a first vibration mode and a second vibration mode, for example, a stretching vibration mode in a longitudinal direction of the piezoelectric member 110 and a bending vibration mode in a thickness direction thereof. The first and second vibration modes are limited to the stretching and bending vibration modes, but any vibration modes capable of generating an elliptic motion of the frictional member 30 can be used. Various internal electrodes, external electrodes, and lamination structure of the piezoelectric member 110 are well-known, and thus, detailed description thereof is omitted.

According to the present invention, the frictional member 130 is insertedly attached into the concave portion 111 formed on one side of the piezoelectric member 110, so that the influence of the attachment of the frictional member 130 to a resonance frequency of the piezoelectric member 110 or the piezoelectric motor 100 can be minimized.

Firstly, in case of a general piezoelectric motor 100a where a frictional member 130a is attached on one side of a piezoelectric member 110a, an influence of the attachment of the frictional member 130a to a resonance frequency of the piezoelectric member 110a will be described with reference to FIGS. 2 to 4.

As shown in FIGS. 2A and 2B, the general piezoelectric motor 100a includes the piezoelectric member 110a which is formed by laminating a plurality of piezoelectric devices and the frictional member 130a which is attached on one side of the piezoelectric member 110a.

FIG. 3 illustrates relationships between a frequency and an admittance of the piezoelectric member 110a before and after the attachment of the frictional member 130a on the piezoelectric member 110a. FIG. 4 illustrates relationships between a phase and an admittance of the piezoelectric member 110a before and after the attachment of the frictional member 130a on the piezoelectric member 110a.

In FIGS. 3 and 4, the graphs indicated by A' illustrate vibration characteristics of the piezoelectric member 110a before the attachment of the frictional member 130a on the piezoelectric member 110a, and the graphs indicated by B' illustrate vibration characteristics of the piezoelectric member 110a after the attachment of the frictional member 130a on the piezoelectric member 110a.

Referring to FIGS. 3 and 4, before the attachment of the frictional member 130a on the piezoelectric member 110a (A'), the longitudinal stretching vibration mode has the resonance frequency of about 326 kHz and the anti-resonance frequency of about 334 kHz, and the thickness-direction bending vibration mode has the anti-resonance frequency of about 332 kHz and the resonance frequency of about 333 kHz. Namely, before the attachment of the frictional member 130a on the piezoelectric member 110a (A'), the frequency of the second vibration mode, that is, the bending vibration mode is located between the resonance frequency and the anti-resonance frequency of the first vibration mode, that is, the longitudinal stretching vibration mode On the contrary, after the attachment of the frictional member 130a on the piezoelectric member 110a (B'), the longitudinal stretching vibration mode has the resonance frequency of about 314 kHz and the anti-resonance frequency of about 318 kHz, and the thickness-direction bending vibration mode has the resonance frequency of about 299 kHz and the anti-resonance frequency of about 301 kHz. Namely, after the attachment of the frictional member 130a on the piezoelectric member 110a (B'), the frequency of the second vibration mode, that is, the bending vibration mode is located outside the range between the resonance frequency and the anti-resonance frequency of the first vibration mode, that is, the longitudinal stretching vibration mode.

When the frictional member 130a is attached on the surface of the piezoelectric member 110a, the second bending vibration mode is relatively greatly influenced by a mass of the frictional member 130a, so that a decrease in frequency of the second bending vibration mode is greater than that of the first stretching vibration mode. As a result, the frequency of the second bending vibration mode is lower than the resonance frequency of the first stretching vibration mode.

In this case, the mass effect due to the attachment of the frictional member 130a greatly influences a driving frequency of the piezoelectric motor 100a, so that the vibration characteristics are greatly changed. Therefore, it is difficult to effectively drive and control the piezoelectric motor 100a.

Furthermore, the separation interval between the resonance frequency of the first stretching vibration mode and the resonance frequency of the second bending vibration mode is increased, so that vibration efficiency of the piezoelectric member 110a is greatly deteriorated. As a result, driving efficiency of the piezoelectric motor 100a is deteriorated.

However, according to the present invention, since the frictional member is insertedly attached into a concave portion of the piezoelectric member, the influence of the attachment of the frictional member to the resonance frequency can be minimized.

In the piezoelectric motor 100 according to the present invention, the influence of the attachment of the frictional member 130 to the resonance frequency of the piezoelectric member 110 will be described with reference to FIGS. 5 to 7.

As shown in FIGS. 5A, 5B, 5C, the piezoelectric motor 100 includes a piezoelectric member 110 which is formed by laminating a plurality of piezoelectric devices and has a concave portion 111 indentedly formed on one side 115 of the piezoelectric member 110 and a frictional member 130 which is insertedly attached into the concave portion 111.

According to the vibration characteristics of the piezoelectric member 110 associated with a pattern of internal electrodes, a plurality of the frictional members 130 may be attached on the piezoelectric member 110. In the specification, a case of one frictional member 130 is exemplified.

FIG. 6 illustrates relationships between a frequency and an admittance of the piezoelectric member 110 before the attachment of the frictional member 130 on the piezoelectric member 110 and after the inserted attachment of the frictional member 130 into the concave portion 111 of the piezoelectric member 110. FIG. 7 illustrates relationships between a phase and an admittance of the piezoelectric member 110 before the attachment of the frictional member 130 on the piezoelectric member 110 and after the inserted attachment of the frictional member 130 into the concave portion 111 of the piezoelectric member 110.

In FIGS. 6 and 7, the graphs indicated by A illustrate vibration characteristics of the piezoelectric member 110 before the attachment of the frictional member 130 on the piezoelectric member 110 provided with concave portion 111, and the graphs indicated by B illustrate vibration characteristics of the piezoelectric member 110 after the inserted attachment of the frictional member 130 into the concave portion 111 of the piezoelectric member 110.

Referring to FIGS. 6 and 7, before the attachment of the frictional member 130 on the piezoelectric member 110 provided with the concave portion 111 (A), the longitudinal stretching vibration mode has the resonance frequency of about 333 kHz and the anti-resonance frequency of about 338 kHz, and the thickness-direction bending vibration mode has the anti-resonance frequency of about 335 kHz and the resonance frequency of about 336 kHz. Namely, before the attachment of the frictional member 130 on the piezoelectric member 110 provided with the concave portion 111 (A), the frequency of the second vibration mode, that is, the bending vibration mode is located between the resonance frequency and the anti-resonance frequency of the first vibration mode, that is, the longitudinal stretching vibration mode.

In addition, after the inserted attachment of the frictional member 130 into the concave portion 111 of the piezoelectric member 110 (B), the longitudinal stretching vibration mode has the resonance frequency of about 317 kHz and the anti-resonance frequency of about 324 kHz, and the thickness-direction bending vibration mode has the anti-resonance frequency of about 319 kHz and the resonance frequency of about 321 kHz. Namely, after the inserted attachment of the frictional member 130 into the concave portion 111 of the piezoelectric member 110 (B), the frequency of the second vibration mode, that is, the bending vibration mode is also located between the resonance frequency and the anti-resonance frequency of the first vibration mode, that is, the longitudinal stretching vibration mode.

When the frictional member 130 is insertedly attached into the concave portion 111 of the piezoelectric member 110, the first stretching vibration mode and the second bending vibration mode are substantially equally influenced by a mass of the frictional member 130, so that the frequency of the second vibration mode, that is, the bending vibration mode can be located between the resonance frequency and the anti-resonance frequency of the first vibration mode, that is, the longitudinal stretching vibration mode.

Therefore, the uniform vibration characteristics of the piezoelectric member 110 or the piezoelectric motor 100 are maintained, so that it is possible to effectively drive and control the piezoelectric motor 100. Furthermore, the separation interval between the resonance frequency of the first stretching vibration mode and the resonance frequency of the second bending vibration mode is maintained to be close to each other, so that a suitable vibration efficiency of the piezoelectric member 110 is maintained. As a result, driving efficiency of the piezoelectric motor 100 is greatly increased in comparison with the case of FIG. 2.

In addition, since the contact area between the frictional member 130 and the piezoelectric member 110 is increased, attachment strength of the frictional member 130 is greatly improved. In addition, since the frictional member 130 is disposed into the concave portion 111 of the piezoelectric member 110, a position of attachment of the frictional member 130 can be maintained to be unchanged. Therefore, it is possible to prevent a change in the resonance frequency according to a change in the position of attachment.

Next, an influence of an insertion depth of the frictional member 130 inserted into the concave portion 111 of the piezoelectric member 110, that is, an insertion ratio of the frictional member 130 to the resonance frequency is described with reference to FIGS. 8 to 14.

Referring to FIGS. 8A to 8D, when a thickness of the frictional member 130 and an insertion depth of the frictional member 130 inserted into the concave portion 111 are indicated by w and x, respectively, the piezoelectric motor 100 according to an embodiment of the present invention preferably satisfies an insertion ratio x/w expressed by the following Conditional Equation.

[Conditional Equation]

$$0.1 \leq x/w \leq 0.5$$

Firstly, frequency characteristics of piezoelectric member 110 before the attachment of the frictional member 130 on the piezoelectric member 110 are described with reference to FIGS. 9 and 10.

The following data are obtained by using a finite element analysis program ATILA.

In FIG. 9, LR(♦) and LA(●) indicate resonance and anti-resonance frequencies of the first vibration mode, that is, the stretching vibration mode, and FR(◇) and FA(○) indicate resonance and anti-resonance frequencies of the second vibration mode, that is, the bending vibration mode.

In FIGS. 10, (a), (b), (c), and (d) illustrate a shape of vibration mode at a resonance frequency of a stretching vibration mode, a shape of vibration mode at a resonance frequency of a bending vibration mode, a shape of vibration mode at an anti-resonance frequency of a bending vibration mode, and a shape of vibration mode at an anti-resonance frequency of a stretching vibration mode, respectively.

As shown in FIG. 9, before the attachment of the frictional member 130 on the piezoelectric member 110, the resonance frequency FR(◇) and the anti-resonance frequency FA(○) of the second vibration mode, that is, the bending vibration mode are located between the resonance frequency LR(♦) and the anti-resonance frequency LA(●) of the first vibration mode, that is, the stretching vibration mode.

However, referring to FIGS. 11 to 14, it can be seen that, after the attachment of the frictional member 130 on the piezoelectric member 110, the frequency characteristics can be greatly changed according to the insertion ratio x/w.

Similarly to FIG. 9, in FIG. 11, LR(♦) and LA(●) indicate resonance and anti-resonance frequencies of the first vibration mode, that is, the stretching vibration mode, and FR(◇) and FA(○) indicate resonance and anti-resonance frequencies of the second vibration mode, that is, the bending vibration mode.

FIG. 12 illustrates shapes of vibration modes of the piezoelectric motor in a case where the insertion ratio x/w of the frictional member is 0.2, in which (a), (b), (c), and (d) illustrate a shape of vibration mode at a resonance frequency of a stretching vibration mode, a shape of vibration mode at a resonance frequency of a bending vibration mode, a shape of vibration mode at an anti-resonance frequency of a bending vibration mode, and a shape of vibration mode at an anti-resonance frequency of a stretching vibration mode, respectively.

FIG. 13 illustrates shapes of vibration modes of the piezoelectric motor in a case where the insertion ratio x/w of the frictional member is 0, that is, in a case where the frictional member 130 is attached on the surface of one side of the piezoelectric member 110, in which (a) an (b) illustrate a shape of vibration mode at a resonance frequency of a bending vibration mode and a shape of vibration mode at an resonance frequency of a stretching vibration mode, respectively.

FIG. 14 illustrates shapes of vibration modes of the piezoelectric motor in a case where the insertion ratio x/w of the frictional member is 0.8, in which (a), (b) and (c) illustrate a shape of vibration mode at a resonance frequency of a stretching vibration mode, a shape of vibration mode at an anti-resonance frequency of a stretching vibration mode, and a shape of vibration mode at an resonance frequency of a bending vibration mode, respectively.

Firstly, referring to FIGS. 11 and 13, in a case where the insertion ratio x/w is less than about 0.1, the resonance frequency FR(◇) and anti-resonance frequency FA(○) of the second bending vibration mode are lower than the resonance frequency LR(◆) and the anti-resonance frequency LA(●) of the first stretching vibration mode, so that a suitable coupling effect cannot be obtained. As a result, the vibration efficiency is deteriorated.

Next, referring to FIGS. 11 and 14, in a case where the insertion ratio x/w is more than about 0.5, the resonance frequency FR(◇) and anti-resonance frequency FA(○) of the second bending vibration mode are higher than the resonance frequency LR(◆) and the anti-resonance frequency LA(●) of the first stretching vibration mode, so that a suitable coupling effect cannot be obtained. As a result, the vibration efficiency is deteriorated.

However, referring to FIGS. 11 and 12, in a case where the insertion ratio x/w is in a range of about 0.1 to 0.5, the resonance frequency FR(◇) and anti-resonance frequency FA(○) of the second bending vibration mode are between the resonance frequency LR(◆) and the anti-resonance frequency LA(●) of the first stretching vibration mode, so that a suitable coupling effect can be obtained. As a result, the vibration efficiency is greatly improved.

Although an influence of the mass of the frictional member 130 is slightly different according to material characteristics and sizes of the piezoelectric member 110 and the frictional member 130, in a case where the insertion ratio x/w is in a range of about 0.1 to 0.5, the mass of the frictional member 130 substantially equally influences changes in vibration mode of the first stretching vibration mode and the second bending vibration mode. Therefore, the resonance frequency and the anti-resonance frequency of the bending vibration mode are located between the resonance frequency and the anti-resonance frequency of the stretching vibration mode, so that a suitable coupling effect can be obtained. Accordingly, the vibration efficiency is maximized, so that it is possible to easily drive and control the piezoelectric motor 100.

In addition, in consideration that the mass of the frictional member 130 similarly influences changes in vibration mode of the first stretching vibration mode and the second bending vibration mode, in a case where a plurality of the concave portions 111 are formed on the piezoelectric member 110 and the frictional members 130 are inserted into the concave portions 111, under the condition that the insertion ratio x/w is in a range of about 0.1 to 0.5, a suitable coupling effect can be obtained. Therefore, in this case, it is expected that the vibration efficiency can be maximized.

However, in a case where the insertion ratio x/w is less than 0.1, the second bending vibration mode is relatively greatly influenced by the mass of the frictional member 130, so that a decrease in frequency of the second bending vibration mode is greater than that of the first stretching vibration mode. As a result, the frequency of the second bending vibration mode is lower than the resonance frequency and the anti-resonance frequency of the first stretching vibration mode, so that a suitable coupling effect cannot be obtained. As a result, the vibration efficiency is deteriorated.

However, in a case where the insertion ratio x/w is more than 0.5, the first stretching vibration mode is relatively greatly influenced by the mass of the frictional member 130, so that a decrease in frequency of the first stretching vibration mode is greater than that of the second bending vibration mode. As a result, the frequency of the second bending vibration mode is higher than the resonance frequency and the anti-resonance frequency of the first stretching vibration mode, so that a suitable coupling effect cannot be obtained. As a result, the vibration efficiency is deteriorated.

Namely, in a case where the insertion ratio x/w is less than 0.1 or more than 0.5, the mass effect caused from the attachment of the frictional member 130 greatly influences a driving frequency of the piezoelectric motor 100, so that the vibration characteristics greatly change. As a result, it is difficult to effectively drive and control the piezoelectric motor 100.

Now, a shape of the frictional member 130 is described with reference to FIG. 8.

As shown in FIGS. 8A, 8C, and 8D, the shape of the frictional member 130 is not limited to a specific one. Namely, the frictional member 130 may has a prismatic cross section shown in FIG. 8A or a circular cross section shown in FIG. 8C.

However, in consideration that the frictional member 130 transmits the elliptic motion to a slider or a rotor R (as shown in FIG. 8D) in a contact manner, the frictional member 130 preferably includes a curved-surface protrusion which is formed to protrude outward from the piezoelectric member 110.

Namely, as shown in FIGS. 8C and 8D, it is preferable that the frictional member 130 has a circular or semi-elliptic cross section, or the protrusion thereof has a semi-circular or elliptic cross section.

According to the present invention, a frictional member is inserted attached into a concave portion of a piezoelectric member, so that an influence of the attachment of the frictional member can be minimized.

In addition, according to the present invention, resonance frequencies of a stretching vibration mode and a bending vibration mode are maintained to be close to each other, so that a driving efficiency of a piezoelectric motor can be improved.

In addition, according to the present invention, a contact area between the frictional member and the piezoelectric member is increased, so that attachment strength of the frictional member can be improved. In addition, since the frictional member is disposed into the concave portion of the piezoelectric member, a position of attachment of the frictional member can be maintained to be unchanged. Therefore, it is possible to prevent a change in the resonance frequency according to a change in the position of attachment.

While the present invention has been shown and described in connection with the exemplary embodiments, it will be apparent to those skilled in the art that modifications and variations can be made without departing from the spirit and scope of the invention as defined by the appended claims.

What is claimed is:

1. A piezoelectric motor comprising:
    a piezoelectric member which generates a stretching vibration mode generated in a longtitudinal direction of the piezoelectric member and a bending vibration mode generating in a thickness direction of the piezoelectric member simultaneously by an applied power, wherein the piezoelectric member has a concave portion formed on one side of the piezoelectric member; and
    a frictional member of which a portion is insertedly attached and fixed into the concave portion, wherein the frictional member is in an elliptic motion by the stretching vibration mode and the bending vibration mode and, actuates a rotor to be rotated by friction between the frictional member and the rotor.

2. The piezoelectric motor of claim 1, wherein, when a thickness of the frictional member and an insertion depth of the frictional member inserted into the concave portion are indicated by w and x, respectively, the piezoelectric motor satisfies an insertion ratio x/w expressed by the following Conditional Equation, $$0.1 \leq x/w \leq 0.5. \quad \text{[Conditional Equation]}$$

3. The piezoelectric motor of claim 1,
wherein a plurality of the concave portions are formed on the piezoelectric member, and
wherein the frictional members are insertedly attached and fixed into the concave portions.

4. The piezoelectric motor of claim 1, wherein the frictional member has a circular cross section or a prismatic cross section.

5. The piezoelectric motor of claim 1, wherein the frictional member includes a curved-surface protrusion which is formed to protrude outward from the piezoelectric member.

6. The piezoelectric motor of claim 1, wherein the frictional member is fixed in the concave portion by making the contact with an entire surface of the concave portion.

* * * * *

UNITED STATES PATENT AND TRADEMARK OFFICE
CERTIFICATE OF CORRECTION

PATENT NO. : 7,576,474 B2  Page 1 of 1
APPLICATION NO. : 11/907522
DATED : August 18, 2009
INVENTOR(S) : Koc et al.

It is certified that error appears in the above-identified patent and that said Letters Patent is hereby corrected as shown below:

Column 10, Line 53, change "longtitudinal" to --longitudinal--.

Signed and Sealed this

Fifth Day of January, 2010

David J. Kappos
*Director of the United States Patent and Trademark Office*